(12) United States Patent
Chang

(10) Patent No.: US 11,581,219 B2
(45) Date of Patent: Feb. 14, 2023

(54) SEMICONDUCTOR STRUCTURE AND FORMING METHOD THEREOF

(71) Applicant: CHANGXIN MEMORY TECHNOLOGIES, INC., Hefei (CN)

(72) Inventor: Chih-Wei Chang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/599,413

(22) PCT Filed: Apr. 12, 2021

(86) PCT No.: PCT/CN2021/086620
§ 371 (c)(1),
(2) Date: Sep. 28, 2021

(87) PCT Pub. No.: WO2021/208855
PCT Pub. Date: Oct. 21, 2021

(65) Prior Publication Data
US 2022/0262676 A1   Aug. 18, 2022

(30) Foreign Application Priority Data
Apr. 16, 2020   (CN) .......................... 202010299490.5

(51) Int. Cl.
*H01L 23/48*  (2006.01)
*H01L 21/768*  (2006.01)
*H01L 21/306*  (2006.01)

(52) U.S. Cl.
CPC .. *H01L 21/76816* (2013.01); *H01L 21/30604* (2013.01); *H01L 21/76877* (2013.01); *H01L 21/76898* (2013.01); *H01L 23/481* (2013.01)

(58) Field of Classification Search
CPC ......... H01L 21/76816; H01L 21/30604; H01L 21/76877; H01L 21/76898; H01L 23/481
See application file for complete search history.

(56) References Cited

U.S. PATENT DOCUMENTS 7,485,967 B2   2/2009  Kameyama et al.
7,670,955 B2   3/2010  Kameyama et al.
(Continued)

FOREIGN PATENT DOCUMENTS

CN       1779961 A      5/2006
CN     100429963 C     10/2008
(Continued)

OTHER PUBLICATIONS

International Search Report and English Translation as cited in PCT/CN2021/086620 dated Jul. 2, 2021, pp. 5.
(Continued)

*Primary Examiner* — Victor A Mandala
*Assistant Examiner* — Colleen E Snow
(74) *Attorney, Agent, or Firm* — Cooper Legal Group, LLC

(57) ABSTRACT

The present disclosure relates to the field of semiconductor packaging processes, and provides a semiconductor structure and a forming method thereof. The forming method includes: providing a semiconductor substrate, where a surface of the semiconductor substrate is provided with an exposed conductive structure; forming a passivation layer on the surface of the semiconductor substrate and a surface of the exposed conductive structure; etching the passivation layer to form a recess, where a bottom of the recess exposes one end of the conductive structure; forming an adhesion layer on a surface of the recess; and etching to form a hole in the bottom of the recess.

15 Claims, 5 Drawing Sheets

(56) References Cited

U.S. PATENT DOCUMENTS

| | | | |
|---|---|---|---|
| 9,159,672 B1 | 10/2015 | Hiner et al. | |
| 2002/0050649 A1 | 5/2002 | Ahn | |
| 2014/0167254 A1* | 6/2014 | Yu .......................... | H01L 24/17 |
| | | | 257/737 |
| 2014/0264917 A1* | 9/2014 | Huang .................. | H01L 23/481 |
| | | | 257/774 |
| 2015/0179545 A1 | 6/2015 | Jeong et al. | |
| 2021/0407944 A1* | 12/2021 | Wang ...................... | H01L 24/11 |

FOREIGN PATENT DOCUMENTS

| | | |
|---|---|---|
| CN | 104733428 A | 6/2015 |
| CN | 104143544 B | 8/2016 |
| JP | 2009259876 A | 11/2009 |
| TW | 507323 B | 10/2002 |

OTHER PUBLICATIONS

Written Opinion and English Translation as cited in PCT/CN2021/086620 dated Jul. 2, 2021, 4 pages.

\* cited by examiner

SEMICONDUCTOR STRUCTURE AND FORMING METHOD THEREOF

CROSS REFERENCE TO RELATED APPLICATION

This patent disclosure claims the benefit and priority of Chinese Patent Application No. 202010299490.5, filed on Apr. 16, 2020 and entitled "SEMICONDUCTOR STRUCTURE AND FORMING METHOD THEREOF", the disclosure of which is incorporated by reference herein in its entirety as part of the present disclosure.

TECHNICAL FIELD

The present disclosure relates to the field of semiconductor packaging processes, in particular to a semiconductor structure and a forming method thereof.

BACKGROUND

With the shrinking of the feature size of the semiconductor integrated circuit devices, the requirements for the semiconductor packaging processes technology are becoming increasingly stringent. The through-silicon via (TSV) packaging technology is to connect the chips vertically to realize the interconnection between the chips. It can realize the maximum stacking density in the three-dimensional (3D) direction and minimum overall size of the chips, and substantially improve speed and lower the power consumption performance of the chips.

The manufacturing process of the TSV packaging technology involves wafer hetero-bonding. It needs to control the depth of the contact surface of the metal layer at 1 to 5 nm, which imposes extremely high requirements for the process technology, making it hard to control. If the metal layer is too deep, there will be an open circuit between the metal sand cannot be connected. If the metal layer is too shallow, when the metal layer is squeezed by the bonding surface, it will be separated even after bonding or short-circuit with the adjacent metal layer. Therefore, it is necessary to control the stability of the back-side via exposure device in the chemical-mechanical process to avoid the open circuit problem of a too deep metal layer and the short circuit problem of a too shallow metal layer during chemical mechanical planarization, which is a technical problem that needs to be solved urgently.

SUMMARY

The forming method comprises:

providing a semiconductor substrate, where a surface of the semiconductor substrate is provided with an exposed conductive structure;

forming a passivation layer on the surface of the semiconductor substrate and a surface of the exposed conductive structure;

etching the passivation layer to form a recess, where a bottom of the recess exposes one end of the conductive structure;

forming an adhesion layer on a surface of the recess; and
etching to form a hole in the bottom of the recess.

Optionally, the forming an adhesion layer on a surface of the recess may comprise: gradually reducing a thickness of the adhesion layer along a direction from a sidewall of the recess to the bottom of the recess until the sidewall of the recess is exposed.

Optionally, the exposed sidewall of the recess may have a height of 1-5 μm.

Optionally, the etching to form a hole may comprise: etching the exposed sidewall of the recess by an isotropic etching process to form the hole, where the hole may be continuously arranged at a periphery of the bottom of the recess.

Optionally, the hole may have a circular cross section or an elliptical cross section, and the hole has a size of 1-5 μm.

Optionally, the recess may have a size of 5-30 μm.

Optionally, the adhesion layer may be made of tantalum, tantalum nitride or a combination thereof.

Optionally, a seed layer may be deposited on a surface of the adhesion layer.

Optionally, after etching to form the hole in the bottom of the recess, the forming method may further comprise: forming a barrier layer on an inner surface of the hole.

Optionally, the barrier layer may have a thickness of 80-120 nm.

Optionally, a metal layer may be filled into the recess.

Correspondingly, the present disclosure further provides a technical solution: a semiconductor structure. The semiconductor structure comprises:

a semiconductor substrate, where a surface of the semiconductor substrate is provided with an exposed conductive structure;

a passivation layer, deposited on the surface of the semiconductor substrate and a surface of the exposed conductive structure;

a recess, located in the passivation layer, where a bottom of the recess exposes one end of the conductive structure;

an adhesion layer, deposited on a surface of the recess;
a hole, located in the bottom of the recess; and
a metal layer, filled into the recess.

Optionally, a barrier layer may be deposited on an inner surface of the hole.

Optionally, the hole may be continuously arranged at a periphery of the bottom of the recess.

REFERENCE NUMERALS

100. semiconductor substrate; 200. conductive structure; 101. passivation layer; w. recess; 102. adhesion layer; 201. hole; 103. barrier layer; and 300. metal layer.

DETAILED DESCRIPTION

To describe the technical solutions in the embodiments of the present disclosure more clearly, the accompanying drawings required to describe the embodiments are briefly described below. Apparently, the accompanying drawings described below are only some embodiments of the present disclosure. A person of ordinary skill in the art may further obtain other accompanying drawings based on these accompanying drawings without creative efforts.

Step 1: A semiconductor substrate is provided, where a surface of the semiconductor substrate is provided with an exposed conductive structure.

Figure 1:
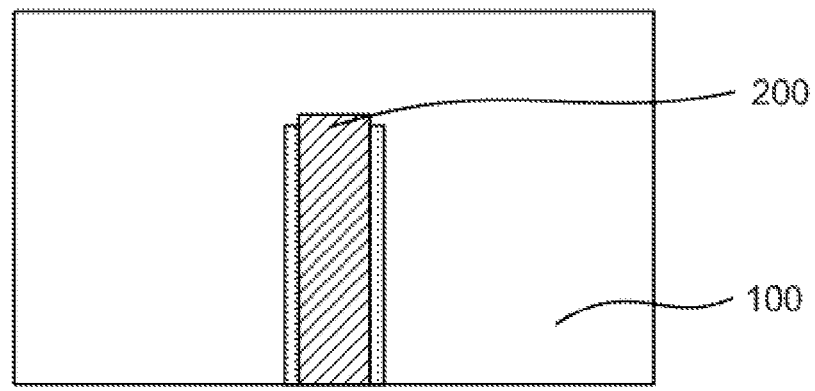
FIGS. 1 to 9 are schematic diagrams of structures obtained by sequentially implementing various steps in a forming method of a semiconductor structure according to an embodiment of the present disclosure.
Figure 2:
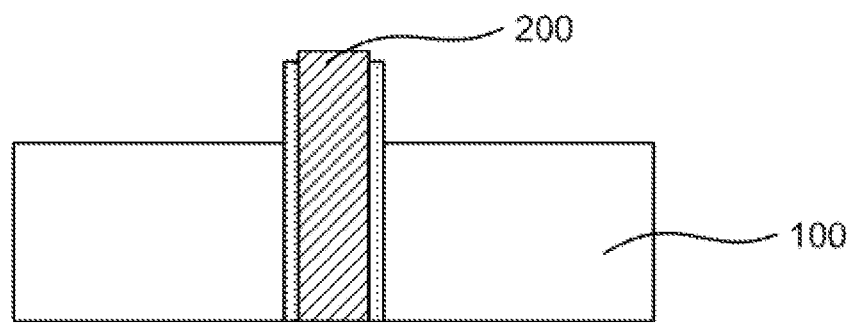

In an embodiment, the semiconductor substrate with an exposed conductive structure on the surface may be formed as follows:

Referring to FIG. 1, a semiconductor substrate 100 is provided. The semiconductor substrate 100 is provided therein with a conductive structure 200. One end of the conductive structure 200 is located on a second surface of the semiconductor substrate 100, and the other end of the conductive structure 200 is built into a first surface of the semiconductor substrate 100. In an embodiment, the semiconductor substrate 100 is a wafer; the first surface is a back face of the wafer, and the second surface is a front face of the wafer. Referring to FIG. 2, a part of a semiconductor substrate layer on the first surface is removed by a grinding process to expose the conductive structure 200. The conductive structure 200 is exposed on the first surface of the semiconductor substrate 100, thereby forming the semiconductor substrate 100 with the exposed conductive structure 200.

A semiconductor substrate 100 is provided. The semiconductor substrate 100 may include, but is not limited to, a monocrystalline silicon substrate, a polycrystalline silicon substrate, a gallium nitride substrate or a sapphire substrate. In addition, when the semiconductor substrate 100 is a monocrystalline substrate or a polycrystalline substrate, it may also be an intrinsic silicon substrate or a doped silicon substrate. Further, it may be an N-type polycrystalline silicon substrate or a P-type polycrystalline silicon substrate.

The exposed conductive structure 200 passes through the surface of the semiconductor substrate 100. The exposed conductive structure 200 may be, but is not limited to, made of a related conductive material such as tungsten and copper used in an integrated circuit. Further, a silicon oxide or silicon nitride isolation layer is provided on a sidewall of the conductive structure 200 to prevent the conductive material copper from diffusing into the semiconductor substrate.

Figure 3:
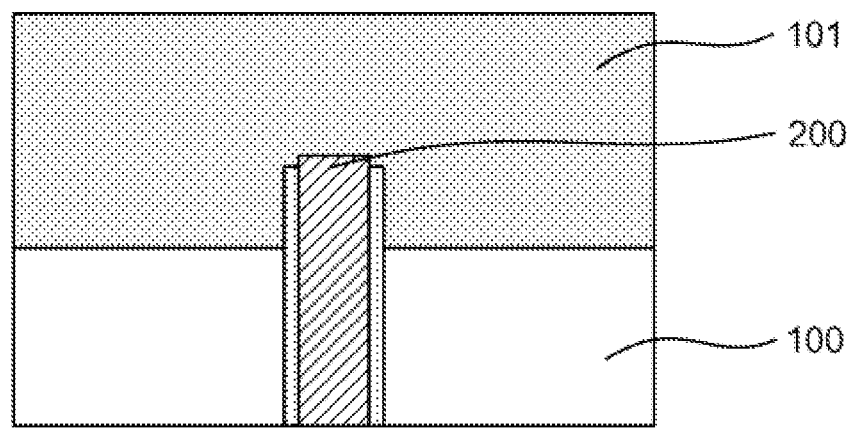

Step 2: Referring to FIG. 3, a passivation layer 101 is formed on the surface of the semiconductor substrate 100 and the surface of the exposed conductive structure 200.

Specifically, a passivation layer 101 is deposited on the surface of the semiconductor substrate 100 and the surface of the exposed conductive structure 200 through a deposition process. In the thin film deposition process, there are two main deposition methods: chemical vapor deposition (CVD) and physical vapor deposition (PVD). CVD is a growth technology in which one or several substances of gas are activated in a certain way and undergo a chemical reaction on the surface of a substrate to deposit a required solid thin film. PVD is a technology that uses a certain physical process to achieve the transfer of substances, that is, to transfer atoms or molecules to the surface of a silicon substrate and deposit them into a thin film. Thin film deposition processes further include spin coating and electroplating, etc. In this embodiment, the specific deposition process of the passivation layer 101 may vary. For example, the CVD process may be used to deposit a passivation layer 101 with a predetermined thickness distribution on the surface of the semiconductor substrate 100. Further, the control means for controlling the flow velocity of the introduced gas flow, controlling the flow rate of the introduced gas flow, controlling the deposition time or controlling the deposition temperature may be used alone. By improving the control accuracy of the gas flow and temperature, it can ensure that all atoms are arranged neatly during deposition to form a monocrystalline layer. Finally, a passivation layer 101 with a uniform thickness is formed on the surface of the semiconductor substrate 100 and the surface of the exposed conductive structure 200.

Commonly used deposition materials include silicon dioxide, silicon nitride and other insulating materials used for isolating interconnection layers. Therefore, the materials of the passivation layer 101 may include, but are not limited to, silicon dioxide, silicon nitride, silicon oxynitride and other related insulating materials used in an integrated circuit.

Figure 4:
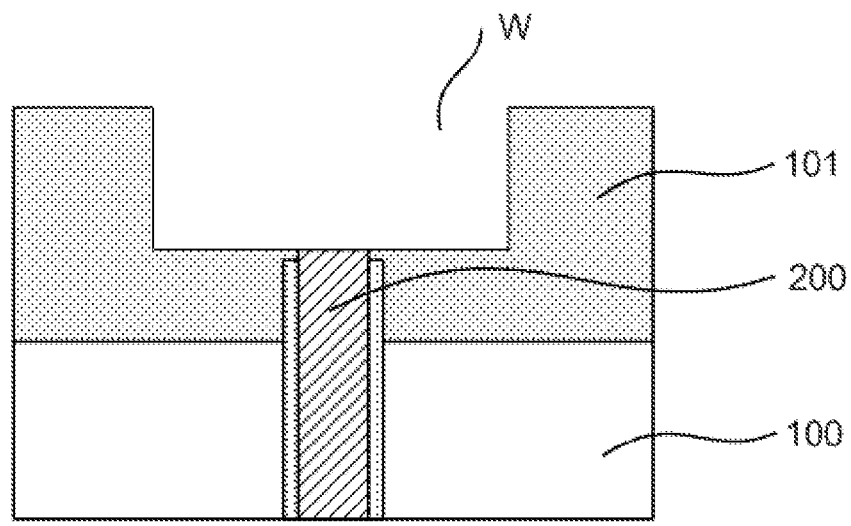

Step 3: Referring to FIG. 4, a surface of the passivation layer 101 is etched to form a recess w, where the bottom of the recess w exposes one end of the conductive structure 200.

Specifically, before the passivation layer 101 is etched, the method further comprises: a patterned first mask layer (not shown) is further formed on the surface of the passivation layer 101. The first mask layer is provided with patterns arranged at intervals. According to the patterns arranged at intervals on the first mask layer, the passivation layer 101 is etched, such that the patterns of the first mask layer are transferred to the passivation layer 101.

Further, the recess has a size of 5-30 μm, that is, the recess has a depth of 5-30 μm, such as 10 μm, 15 μm, 20 μm or 25 μm. The recess may appear as a circle, a square or other irregular shape. Those skilled in the art may understand that, in the packaging process, the through-silicon via (TSV) process needs to connect a semiconductor substrate, a conductive structure and a via to meet the requirements of other subsequent process steps.

Figure 5:
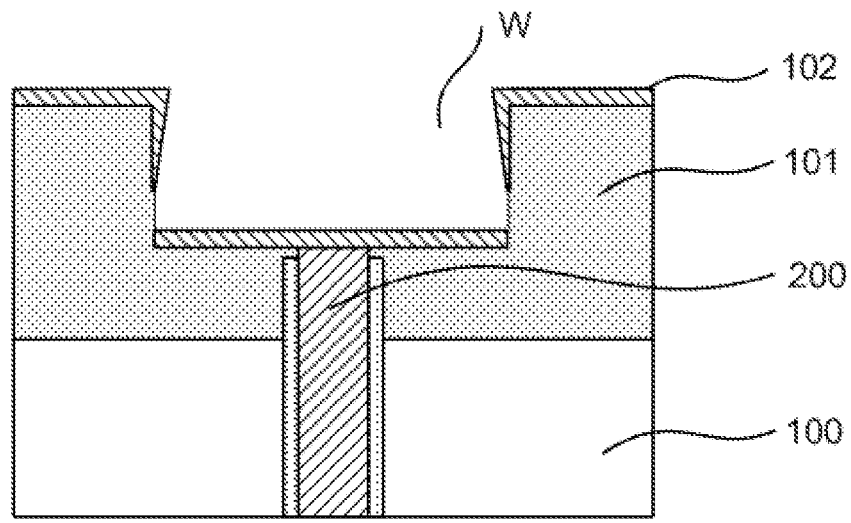

Step 4: Referring to FIG. 5, an adhesion layer 102 is formed on a surface of the recess w.

Specifically, an adhesion layer 102 is deposited on the surface of the recess w after the above etching by a sputtering process. The adhesion layer 102 covers a part of a sidewall of the recess, the bottom of the recess and a surface of the passivation layer 101 away from the bottom of the recess. In an embodiment, a thickness of the adhesion layer 102 is gradually reduced along a direction from the sidewall of the recess to the bottom of the recess until the sidewall of the recess is exposed. Since the sputtering process has poor coverage on a vertical surface, corners of the recess are the least likely to be covered. In this embodiment, by controlling the deposition rate, an inverted triangle-shaped adhesion layer 102 is deposited on the sidewall of the recess, and the adhesion layer 102 is not deposited on the sidewall of the recess near the bottom. Wherein, the lower sidewall of the recess not covered by the adhesion layer 102 has a height of 1-5 μm, for example, 2 μm or 4 μm. Meanwhile, the adhesion layer 102 is made of tantalum, tantalum nitride or a combination thereof. The adhesion layer 102 has a thickness of 35-45 nm, for example, 40 nm. Therefore, by controlling the sputtering process to form the adhesion layer 102, the height of the lower sidewall of the recess not covered by the adhesion layer is controlled, thereby controlling the size of the hole 201 to be formed later. In addition, the adhesion layer 102 formed by deposition is favorable for the deposition of a uniform and dense seed layer on the substrate later.

Further, in another embodiment, a seed layer (not shown) may be deposited on a surface of the adhesion layer 102. The seed layer is made of copper. The seed layer has a thickness of 80-120 nm, for example, 100 nm. In order to facilitate the filling of a metal layer in the subsequent process, the copper seed layer may be formed in advance in this step. Of course, the seed layer may also not be deposited in this step of the embodiment. Instead, the metal adhesion layer may be formed before the subsequent electroplating of the metal layer.

Figure 6:
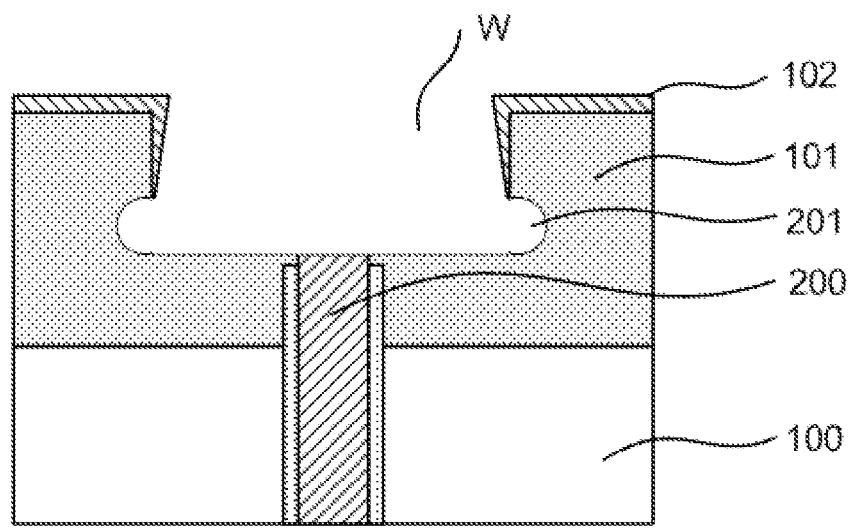

Step 5: Referring to FIG. 6, etching is performed to form the hole 201 in the bottom of the recess.

In an embodiment, the exposed sidewall of the recess is etched by an isotropic etching process to form the hole 201, where the hole 201 is continuously arranged at a periphery of the bottom of the recess.

Figure 10A:
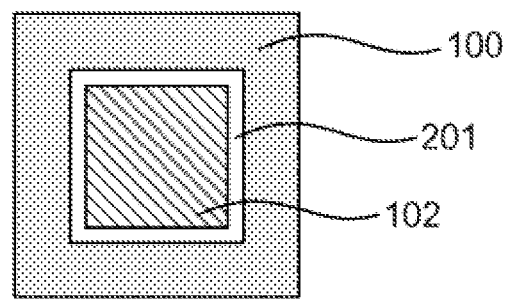
FIGS. 10A and 10B are top cross-sectional views of a semiconductor structure according to an embodiment of the present disclosure.
Figure 10B:
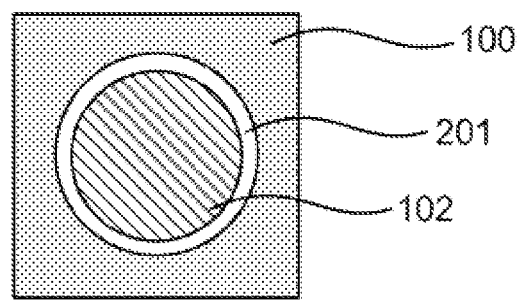

Specifically, the hole 201 is formed by wet etching in the corners of the recess where the adhesion layer 102 is not deposited. In this embodiment, as shown in the top cross-sectional views (FIG. 10A/FIG. 10B), the bottom of the recess w is surrounded by the hole 201, and the continuous hole 201 may be defined as ring-shaped surrounding the bottom of the recess. Since wet etching is an isotropic process, the hole 201 has a circular cross section, an elliptic cross section or other approximately circular cross section. The hole has a size of 1-5 μm. Further, in other embodiments, the hole 201 may also be formed by a chemical dry etching process. The chemical dry etching process achieves the purpose of etching with chemically active atomic groups in the plasma that chemically react with the material to be etched. The core of the etching process is still the chemical reaction, but it does not involve the gas state of the solution. Therefore, the etching effect is somewhat similar to that of wet etching, with high selectivity.

Therefore, compared with some TSV packaging technologies, this embodiment improves the structure process of the semiconductor metal contact hole, that is, a circle of hole is formed at the outer periphery of the bottom of the metal layer. This embodiment uses the hole between the metal layer and the recess of the passivation layer as a buffer for the thermal expansion of the metal, thereby controlling the stability of the back-side via exposure device in the chemical-mechanical process, and also enhancing the ability of wafer bonding. Therefore, the present disclosure improves the performance and reliability of the semiconductor structure after packaging. Meanwhile, compared to the forming of holes at the upper end of the metal layer, the present disclosure avoids the risk of particles getting stuck in the holes in the later chemical mechanical polishing (CMP) process.

Figure 7:
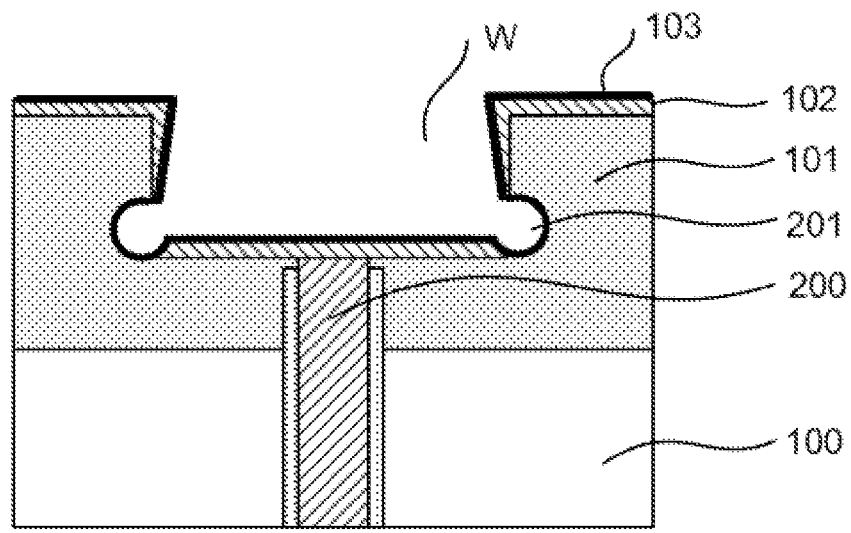

Step 6: Referring to FIG. 7, a barrier layer 103 is formed on an inner surface of the hole 201.

Specifically, after the etching, a barrier layer 103 is deposited on the surface of the adhesion layer 102 in the recess w and the hole 201 by a vapor deposition process. The vapor deposition process has favorable coverage, so it can form a uniform barrier layer 103 on the surface of the adhesion layer 102 in the hole 201. In other embodiments, other suitable processes may also be used to form the barrier layer 103. The barrier layer 103 is made of an insulating material such as silicon nitride. The barrier layer 103 has a thickness of 80-120 nm, for example, 100 nm. The barrier layer 103 on the sidewall and bottom of the recess w is removed by a dry etching process, and the barrier layer 103 in the hole is retained, such that only the barrier layer 103 on the inner surface of the hole 201 is formed. The dry etching process has a favorable anisotropic etching characteristic. During the etching process, the etching gas only etches the barrier layer 103 in a depth direction, and does not penetrate the hole 201, such that the barrier layer 103 in the hole is retained. In this embodiment, the barrier layer 103 can prevent the high temperature of the metal from diffusing into the passivation layer 101 through the hole 201 during subsequent deposition of a metal layer 300 to form a parasitic capacitance. At the same time, it can also prevent the thermal expansion of the metal from buffering to the hole 201 and penetrating the passivation layer 101 during bonding. Therefore, by forming a barrier layer 103 in the hole 201, this embodiment can improve the yield of the semiconductor structure in the semiconductor manufacturing process.

Figure 8:
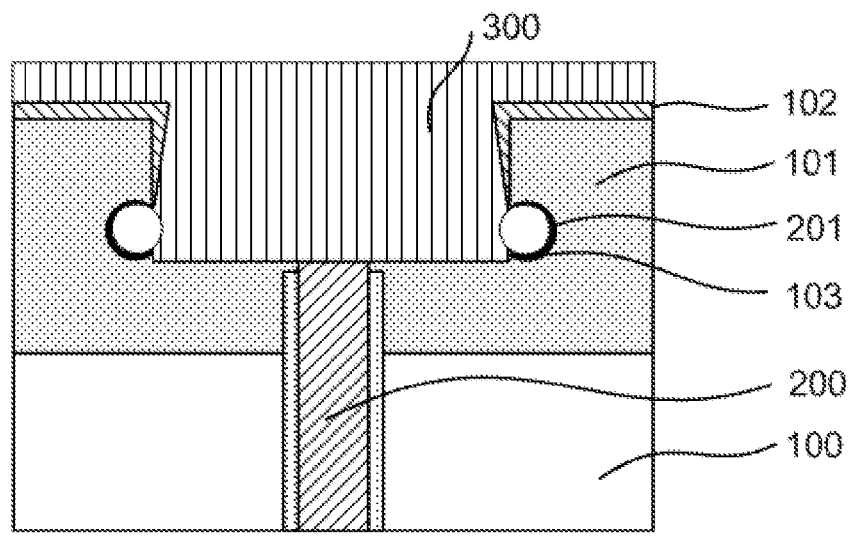

Step 7: Referring to FIG. 8, a metal layer 300 is filled into the recess w.

Figure 9:
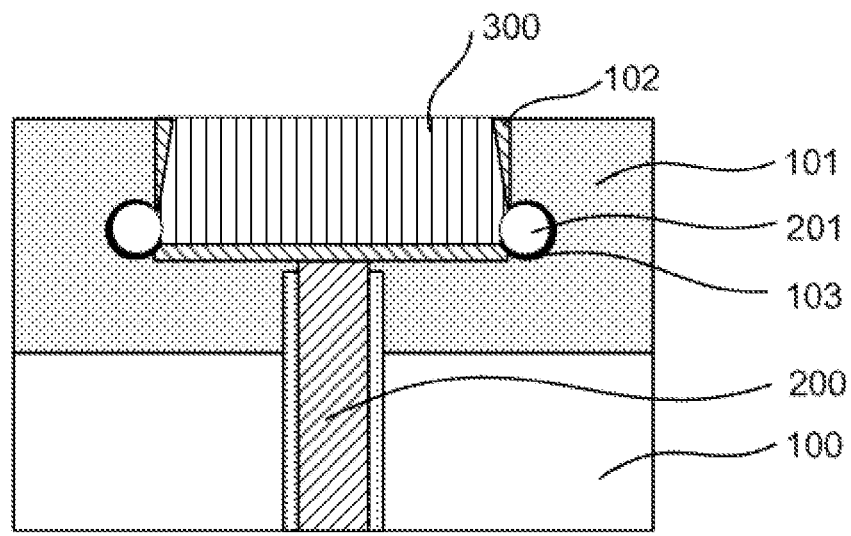

Specifically, copper is filled into the recess by an electroplating technology. The materials of the metal layer 300 may be, but are not limited to, tungsten, copper, aluminum and other related conductive materials used in an integrated circuit. In another embodiment, before the metal layer 300 is deposited by an electroplating process, a seed layer (not shown) may be sputtered on the surface of the adhesion layer 102, and then an electroplating process may be performed. During the electroplating process, since there is no seed layer in the hole 201, no electroplated metal will be formed in the hole 201. Referring to FIG. 9, excesses of the metal layer 300 and the adhesion layer 102 on the upper surface of the passivation layer 101 are planarized by a CMP process.

An embodiment of the present disclosure further provides a semiconductor structure, as shown in FIG. 9.

The semiconductor device includes: a semiconductor substrate 100, a conductive structure 200, a passivation layer 101, a recess w, an adhesion layer 102, a hole 201 and a metal layer 300.

A surface of the semiconductor substrate 100 is provided with an exposed conductive structure 200. The exposed conductive structure 200 passes through the surface of the semiconductor substrate 100. The exposed conductive structure 200 may be, but is not limited to, made of a related conductive material such as tungsten and copper used in an integrated circuit. Further, a silicon oxide or silicon nitride isolation layer is provided on a sidewall of the conductive structure 200 to prevent the conductive materials like copper from diffusing into the semiconductor substrate.

The semiconductor substrate 100 may include, but is not limited to, a monocrystalline silicon substrate, a polycrystalline silicon substrate, a gallium nitride substrate or a sapphire substrate. In addition, when the semiconductor substrate 100 is a monocrystalline substrate or a polycrystalline substrate, it may also be an intrinsic silicon substrate or a doped silicon substrate. Further, it may be an N-type polycrystalline silicon substrate or a P-type polycrystalline silicon substrate.

The passivation layer 101 is deposited on the surface of the semiconductor substrate 100 and the surface of the exposed conductive structure 200. The materials of the passivation layer 101 may include, but are not limited to, silicon dioxide, silicon nitride, silicon oxynitride and other related insulating materials used in an integrated circuit.

The recess w is located in the passivation layer 101, and the bottom of the recess w exposes one end of the conductive structure 200. The recess has a size of 5-30 μm, that is, the recess has a depth of 5-30 μm, such as 10 μm, 15 μm, 20 μm or 25 μm. The recess may appear as a circle, a square or other irregular shape. Those skilled in the art may understand that, in the packaging process, the TSV process needs to connect a semiconductor substrate, a conductive structure and a via to meet the requirements of other subsequent process steps.

The adhesion layer 102 is deposited on a surface of the recess w. The adhesion layer 102 is deposited on the surface of the etched recess w by a sputtering process. The adhesion layer 102 covers a part of a sidewall of the recess, the bottom of the recess and a surface of the passivation layer 101 away from the bottom of the recess. A thickness of the adhesion layer 102 is gradually reduced along a direction from the sidewall of the recess to the bottom of the recess until the sidewall of the recess is exposed. Since the sputtering process has poor coverage on a vertical surface, corners of the recess are the least likely to be covered. Therefore, in this embodiment, by controlling the deposition rate, an inverted triangle-shaped adhesion layer 102 is deposited on the sidewall of the recess, and the adhesion layer 102 is not deposited on the sidewall of the recess near the bottom. The lower sidewall of the recess not covered by the adhesion layer 102 has a height of 1-5 μm, for example, 2 μm or 4 μm. Meanwhile, the adhesion layer 102 is made of tantalum, tantalum nitride or a combination thereof. The adhesion layer has a thickness of 35-45 nm, for example, 40 nm.

Further, a seed layer (not shown) may be deposited on a surface of the adhesion layer, and the seed layer is made of copper. The seed layer has a thickness of 80-120 nm, for example, 100 nm.

Further, the hole 201 is formed in the bottom of the recess, and the hole 201 is continuously arranged at a periphery of the bottom of the recess. The exposed sidewall of the recess is etched by an isotropic etching process to form the hole 201 at the periphery of the bottom of the recess, and the hole 201 is continuously arranged at the periphery of the bottom of the recess. Specifically, the hole 201 is formed by wet etching in the corners of the recess where the adhesion layer 102 is not deposited. As shown in the top cross-sectional views (FIG. 10A/FIG. 10B), the bottom of the recess w is surrounded by the hole 201, and the continuous hole 201 may be defined as ring-shaped surrounding the bottom of the recess. Since wet etching is an isotropic process, the hole 201 has a circular cross section, an elliptic cross section or other approximately circular cross section. The hole has a size of 1-5 μm.

Further, the barrier layer 103 is deposited on an inner surface of the hole 201. The barrier layer 103 is deposited on the surface of the recess w and the surface of the hole 201 through a vapor deposition process. Then, the barrier layer 103 on the sidewall and bottom of the recess w is removed by a dry etching process, and the barrier layer 103 on the surface of the passivation layer in the hole 201 is retained. The barrier layer 103 is made of an insulating material such as silicon nitride. The barrier layer 103 has a thickness of 80-120 nm, for example, 100 nm. In this embodiment, the barrier layer 103 can prevent the high temperature of the metal from diffusing into the passivation layer through the hole 201 during subsequent deposition of the metal layer 300 to form a parasitic capacitance. At the same time, it can also prevent the thermal expansion of the metal from buffering to the hole 201 and penetrating the passivation layer 101 during bonding. Therefore, by forming a barrier layer 103 in the hole 201, this embodiment can improve the yield of the semiconductor structure in the semiconductor manufacturing process.

Further, the metal layer 300 is filled into the recess. Copper is filled into the recess by an electrochemical plating (ECP) process. The materials of the metal layer 300 may be, but are not limited to, tungsten, copper, aluminum and other related conductive materials used in an integrated circuit.

Therefore, compared with some TSV packaging technologies, this embodiment improves the structure process of the semiconductor metal contact hole, that is, a circle of hole is formed at the outer periphery of the bottom of the metal layer. This embodiment uses the hole between the metal layer and the recess of the passivation layer as a buffer for the thermal expansion of the metal, thereby controlling the stability of the back-side via exposure device in the chemical-mechanical process, and also enhancing the ability of wafer bonding. Therefore, the present disclosure improves the performance and reliability of the semiconductor structure after packaging. Meanwhile, compared to the forming of holes at the upper end of the metal layer, the present disclosure avoids the risk of particles getting stuck in the holes in the later CMP process.

The above described are merely preferred embodiments of the present disclosure. It should be noted that several improvements and replacements may further be made by those of ordinary skill in the art without departing from the principle of the present disclosure, but such improvements and replacements should also be deemed as falling within the protection scope of the present disclosure.

What is claimed is:

1. A forming method of a semiconductor structure, comprising:
   providing a semiconductor substrate, wherein a surface of the semiconductor substrate is provided with an exposed conductive structure;
   forming a passivation layer on the surface of the semiconductor substrate and a surface of the exposed conductive structure;
   etching the passivation layer to form a recess, wherein a bottom of the recess exposes one end of the conductive structure;
   forming an adhesion layer on a surface of the recess;
   etching to form a hole in the bottom of the recess; and
   forming a barrier layer on an inner surface of the hole after the etching to form a hole in the bottom of the recess.

2. The forming method of the semiconductor structure according to claim 1, wherein the forming an adhesion layer on a surface of the recess comprises: gradually reducing a thickness of the adhesion layer along a direction from a sidewall of the recess to the bottom of the recess until the sidewall of the recess is exposed.

3. The forming method of the semiconductor structure according to claim 2, wherein the exposed sidewall of the recess has a height of 1-5 μm.

4. The forming method of the semiconductor structure according to claim 2, wherein the etching to form a hole comprises: etching the exposed sidewall of the recess by an isotropic etching process to form the hole, wherein the hole is continuously arranged at a periphery of the bottom of the recess.

5. The forming method of the semiconductor structure according to claim 1, wherein the hole has a circular cross section or an elliptical cross section, and the hole has a size of 1-5 μm.

6. The forming method of the semiconductor structure according to claim 1, wherein the recess has a size of 5-30 μm.

7. The forming method of the semiconductor structure according to claim 1, wherein the adhesion layer is made of tantalum, tantalum nitride or a combination thereof.

8. The forming method of the semiconductor structure according to claim 1, wherein a seed layer is deposited on a surface of the adhesion layer.

9. The forming method of the semiconductor structure according to claim 1, wherein the barrier layer has a thickness of 80-120 nm.

10. The forming method of the semiconductor structure according to claim 1, wherein the forming method further comprises filling a metal layer into the recess.

11. A semiconductor structure, comprising:
a semiconductor substrate, wherein a surface of the semiconductor substrate is provided with an exposed conductive structure;
a passivation layer, deposited on the surface of the semiconductor substrate and a surface of the exposed conductive structure;
a recess, located in the passivation layer, wherein a bottom of the recess exposes one end of the conductive structure;
an adhesion layer, deposited on a surface of the recess;
a hole, located in the bottom of the recess;
a barrier layer, deposited on an inner surface of the hole; and
a metal layer, filled into the recess.

12. The semiconductor structure according to claim 11, wherein the hole is continuously arranged at a periphery of the bottom of the recess.

13. A forming method of a semiconductor structure, comprising:
providing a semiconductor substrate, wherein a surface of the semiconductor substrate is provided with an exposed conductive structure;
forming a passivation layer on the surface of the semiconductor substrate and a surface of the exposed conductive structure;
etching the passivation layer to form a recess, wherein a bottom of the recess exposes one end of the conductive structure;
forming an adhesion layer on a surface of the recess, wherein the forming an adhesion layer on a surface of the recess comprises: gradually reducing a thickness of the adhesion layer along a direction from a sidewall of the recess to the bottom of the recess until the sidewall of the recess is exposed; and
etching to form a hole in the bottom of the recess.

14. The forming method of the semiconductor structure according to claim 13, wherein the exposed sidewall of the recess has a height of 1-5 μm.

15. The forming method of the semiconductor structure according to claim 13, wherein the etching to form a hole comprises: etching the exposed sidewall of the recess by an isotropic etching process to form the hole, wherein the hole is continuously arranged at a periphery of the bottom of the recess.

* * * * *